(12) United States Patent
Aharoni et al.

(10) Patent No.: US 9,003,252 B1
(45) Date of Patent: Apr. 7, 2015

(54) METHOD AND SYSTEM FOR MEMORY TEST AND REPAIR

(71) Applicant: Marvell Israel (M.I.S.L) Ltd., Yokneam (IL)

(72) Inventors: Dan Aharoni, Beit Horon (IL); Avichai Zalcberg, Petach Tikva (IL); Eyal Herzog, Mevaseret Zion (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 107 days.

(21) Appl. No.: 13/788,884

(22) Filed: Mar. 7, 2013

Related U.S. Application Data

(60) Provisional application No. 61/607,922, filed on Mar. 7, 2012.

(51) Int. Cl.
*G01R 31/28* (2006.01)
*G11C 29/44* (2006.01)
*G06F 11/27* (2006.01)
*G11C 29/00* (2006.01)

(52) U.S. Cl.
CPC ............... *G11C 29/44* (2013.01); *G06F 11/27* (2013.01); *G11C 29/72* (2013.01)

(58) Field of Classification Search
CPC ........ G11C 29/12; G11C 29/24; G11C 29/44; G11C 29/72
USPC .......................... 714/711, 718, 724, 733, 763
See application file for complete search history.

(56) References Cited

U.S. PATENT DOCUMENTS

| | | | |
|---|---|---|---|
| 7,031,866 B1 * | 4/2006 | Behera et al. ................. | 702/117 |
| 7,415,641 B1 * | 8/2008 | Behera et al. ................. | 714/711 |
| 8,010,847 B2 * | 8/2011 | Oberlaender ................... | 714/42 |
| 8,717,838 B1 * | 5/2014 | Mishi et al. ................... | 365/200 |
| 2010/0157703 A1 * | 6/2010 | Fischer et al. ................ | 365/200 |

* cited by examiner

*Primary Examiner* — Shelly A Chase

(57) ABSTRACT

Aspects of the disclosure provide an integrated circuit (IC) chip. The IC chip includes a memory module that includes one or more memory blocks. Each memory block includes a memory array having a first memory portion and a redundant memory portion, a failed memory indicator that, in response to a memory test, is configured to provide an indication of a failed memory portion in the first memory portion, and a wrapper circuit that, in response to the indication of the failed memory portion, is configured to repair the memory array by using the redundant portion instead of the failed memory portion.

19 Claims, 4 Drawing Sheets

METHOD AND SYSTEM FOR MEMORY TEST AND REPAIR

INCORPORATION BY REFERENCE

This present disclosure claims the benefit of U.S. Provisional Application No. 61/607,922, "PRODUCTION TESTING AND REPAIR OF MEMORIES IN A SYSTEM" filed on Mar. 7, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the integrated circuit (IC) industry, memory density, measured for example as the number of bits per unit area, continues to increase significantly. The increase of the memory density as well as an increase in the number of bits on a chip can lower memory yield, and also increase memory test time.

SUMMARY

Aspects of the disclosure provide an integrated circuit (IC) chip. The IC chip includes a memory module that includes one or more memory blocks. Each memory block includes a memory array having a first memory portion and a redundant memory portion, a failed memory indicator within the memory block that, in response to a memory test, is configured to provide an indication of a failed memory portion in the first memory portion, and a wrapper circuit that, in response to the indication of the failed memory portion, is configured to repair the memory array by using the redundant portion instead of the failed memory portion.

According to an embodiment of the disclosure, the failed memory indicator is a part of the wrapper circuit. In an example, the wrapper circuit includes a state machine configured to provide the indication of the failed memory portion.

According to an aspect of the disclosure, the memory module includes a module control circuit configured to cause the memory test to be performed in the memory blocks. Further, in an embodiment, the module control circuit includes a built-in self-test (BIST) circuit configured to generate BIST configurations for the memory test to be performed in the memory blocks. In an example, the module control circuit is configured to broadcast the BIST configurations to the memory blocks to perform the memory test in the memory blocks. In another example, the module control circuit is configured to broadcast the BIST configurations to the memory blocks to perform memory re-test in the memory blocks after the wrapper circuit repairs the memory array.

Further, in an embodiment, the IC chip includes a control circuit coupled with the memory module and other memory modules in a server-client manner to control memory test and memory repair. In an example, the control circuit is configured to store information of the failed memory portion of the memory block and load the stored information to the memory block in response to a next power-up. The control circuit can operate in response to at least one of a tester that tests the IC chip and a host controller coupled with the IC chip in a system.

According to an aspect of the disclosure, the wrapper circuit includes a soft repair register (SRR) configured to cause using the redundant portion instead of the failed memory portion.

Aspects of the disclosure also provide a method of repairing a memory block. The memory block has a memory array including a first memory portion and a redundant memory portion. The method includes providing, within the memory block, an indication of a failed memory portion in the first memory portion of the memory array in response to a memory test, and repairing the memory array by using the redundant portion instead of the failed memory portion based on the indication within the memory block that is indicative of the failed memory portion.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
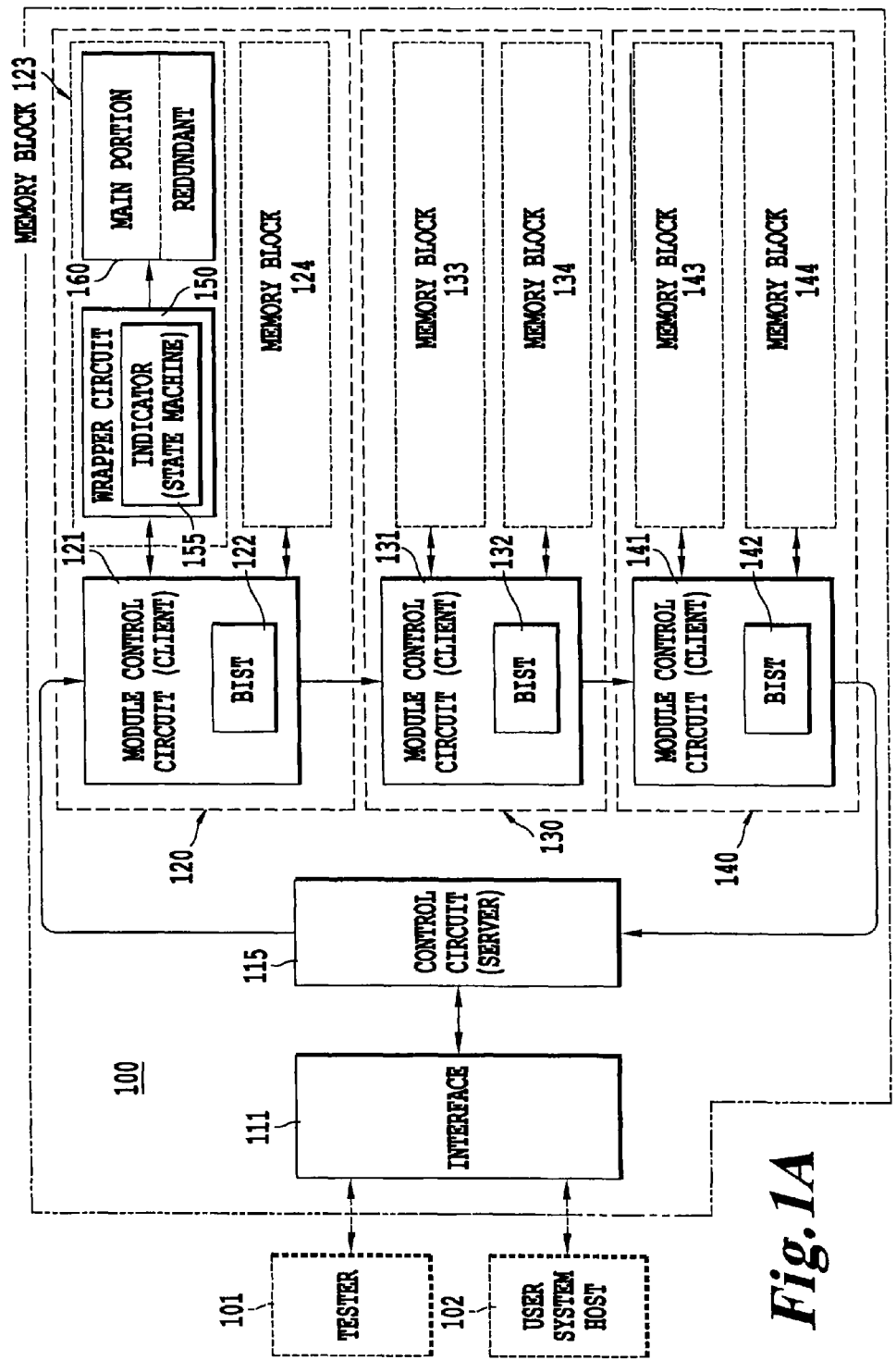
FIG. 1A shows a block diagram of an integrated circuit (IC) chip example 100 according to an embodiment of the disclosure.

FIG. 1A shows a block diagram of an integrated circuit (IC) chip example 100 according to an embodiment of the disclosure. The IC chip 100 includes a plurality of memory modules 120, 130 and 140 that are self-testable, self-analyzable, and self-reparable. Further, the IC chip 100 includes a control circuit 115 coupled with the plurality of memory modules 120, 130 and 140 in a server-client based architecture to control on-chip memory test and repair.

Using the memory module 120 as an example, the memory module 120 includes a plurality of memory blocks 123-124, and a module control circuit 121 coupled together as shown in FIG. 1A. While FIG. 1A shows two memory blocks 123 and 124, it should be understood that the memory module 120 can include more than two memory blocks. The module control circuit 121 includes various suitable control circuits to control the memory test and memory repair in the memory blocks 123-124.

In an embodiment, the module control circuit 121 includes a built-in self-test (BIST) circuit 122 configured to generate BIST configurations, such as test vectors, and the like, for performing memory test on the memory blocks 123-124. In an example, the module control circuit 121 broadcasts the BIST configurations to the memory blocks 123-124 to perform memory test on the memory blocks 123-124 at the same time to save test time.

Further, in an embodiment, the module control circuit 121 includes a repair control circuit (not shown) configured to broadcast a repair instruction to the memory blocks 123-124 to perform self-repair, and then control the BIST circuit 122 to generate the BIST configurations and broadcast the BIST configurations to the memory blocks 123-124 to perform memory re-test after the self-repair.

Additionally, in an embodiment, the module control circuit 121 includes communication circuit (not shown) configured to enable communication with the control circuit 115 and the other memory modules, such as the memory module 130, and the like.

Each of the memory blocks 123-124 is self-reparable memory block. Using the memory block 123 as an example, the memory block 123 includes a memory structure 160 and a wrapper circuit 150 coupled together as shown. The memory structure 160 includes a main memory portion and a redundant memory portion. When the main memory portion has a defective portion, the redundant memory portion can be used in the place of the defective portion during operation.

Figure 1B:
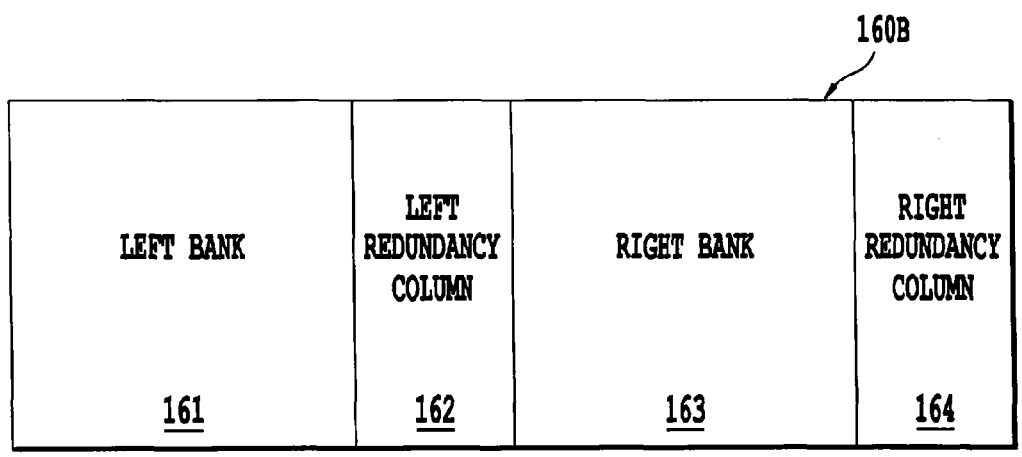
FIG. 1B shows a diagram of a reparable memory structure according to an embodiment of the disclosure.

FIG. 1B shows a diagram of a reparable memory structure example 160B according to an embodiment of the disclosure. In the example embodiment, the reparable memory structure 160B includes a left bank and a right bank of memory cells that form the main memory portion of the reparable memory structure 160B. In an example, the left bank and the right bank respectively include an array of memory cells that are arranged in rows and columns. The memory cells can be any suitable memory cells, such as read-only memory (ROM) cells, static random access memory (SRAM) cells, and the like.

Further, in the FIG. 1B example, the reparable memory structure 160B includes a left redundancy column 162 and a right redundancy column 164 that form the redundant memory portion. In a memory repair example, when a column of memory cells in the left bank 161 has one or more defective cells, the left redundancy column 162 is used in place of the defective column during memory operation. Similarly, when a column of memory cells in the right bank 163 has one or more defective cells, the right redundancy column 164 is used in the place of the defective column during memory operation.

It is noted that the reparable memory structure 160B can be suitably modified. In an example, the reparable memory structure 160B can be modified to be multi-column reparable for the left bank 161 or for the right bank 163. In another example, the reparable memory structure 160B can be modified to repair defective rows in the memory banks 161 and 163.

Further, in the FIG. 1A example, the wrapper circuit 150 is configured to enable memory repair in the memory structure 160. In an example, the wrapper circuit 150 includes an indicator circuit 155 configured to supply information of a defective memory portion, such as a failed memory cell, a failed column, a failed row, and the like in response to a memory test. Based on the defective memory portion, the wrapper circuit 150 causes the redundant portion of the memory structure 160 to be used in the place of the defective memory portion during memory operations, such as write operation, read operation, and the like.

According to an embodiment of the disclosure, the indicator circuit 155 is implemented as a state machine. The state machine is configured to analyze responses from the memory block 123 in response to the memory test, such as the BIST configurations, and to determine whether any portion of the memory structure 160 fails the memory test and is defective. The information of the defective memory portion can be stored and indicated as a specific state of the state machine.

Based on the information of the defective portion, the wrapper circuit 150 can cause the redundant portion of the memory structure 160 to be used in the place of the defective memory portion during memory operation. In an embodiment, the wrapper circuit 150 includes a register to store the repair information. For example, when the wrapper circuit 150 identifies a failed memory cell, the information is converted and stored into a reparable column soft repair register (SRR) to use a redundancy column to replace the column that includes the failed memory cell. Thus, in an example, the IC chip 100 is self-repaired and users of the IC chip 100 do not need to be aware of the defective memory portion.

According to an embodiment of the disclosure, other memory blocks in the memory module 120, such as the memory block 124, and the like, operate similarly to the memory block 123 described above. The other memory blocks also utilize certain components that are identical or equivalent to those used in the memory block 123; the description of these components has been provided above and will be omitted here for clarity purposes.

According to an aspect of the disclosure, the module control circuit 121 broadcasts the BIST configurations to the memory blocks 123-124 to perform memory test on the memory blocks 123-124 at the same time to save test time. Further, the memory blocks 123-124 provide data logs, such as information of the defective portions, repair statistics, and the like to the module control circuit 121. In an example, when the data logs indicate that the defective portions can be repaired by the redundant portion, the module control circuit 121 provides repair instructions to the memory blocks 123-124 to cause memory repair in the memory blocks 123-124. After the memory repair, the module control circuit 121 broadcasts the BIST configurations to the memory blocks 123-124 to re-test the memory blocks 123-124 and confirm suitable operation of the memory blocks 123-124.

In an embodiment, the module control circuit 121 repetitively broadcasts repair instructions until the memory blocks 123-124 pass re-test or one of the memory blocks 123-124 runs out of repair resources, for example runs out of suitable redundant portions to repair the corresponding memory block.

Further, in an embodiment, the memory modules 130 and 140 operate similarly to the memory module 120 described above. The memory modules 130 and 140 also utilize certain components that are identical or equivalent to those used in the memory module 120; the description of these components has been provided above and will be omitted here for clarity purposes.

According to an aspect of the disclosure, the memory modules 120, 130 and 140 are coupled with the control circuit 115 to enable broadcast. In the FIG. 1A example, the memory modules 120, 130 and 140 are interconnected in a pipe to flow information, such as instructions, configurations, data logs, and the like in a single direction. The pipe is a serial connection of the memory modules 120, 130, 140 and the like to the control circuit 115. Multiple pipes can be connected to the control unit 115 in parallel.

Specifically, the memory module 120 is coupled with the control circuit 115 to receive information, such as instructions, and the like, from the control circuit 115. Further, the memory module 120 is coupled with the memory module 130 to convey information, such as the instructions, data logs of the memory module 120, and the like, to the memory module 130. Subsequently, the memory module 130 is coupled with the memory module 140 to convey information, such as the instructions, the data logs of the memory module 120, data logs of the memory module 130, and the like to the memory module 140. The memory module 140 is coupled to the control circuit 115 to convey information, such as the data logs of the memory module 120 and the memory module 130, data logs of the memory module 140, to the control circuit 115.

It is noted that although an instruction from the control unit 115 passes through all the memory modules 120, 130, 140 and the like in the pipe, the instruction can be directed to one or more of the memory blocks 123, 124, 133, 134, 143 and 144, or one or more of the memory modules 120, 130 and 140 by using suitable addressing technique.

During operation, in an example, the control circuit 115 broadcasts a test instruction to the memory modules 120, 130 and 140 through the pipe. In response to the test instruction, the memory modules 120, 130 and 140 respectively perform memory built-in self-test. After the test, the memory modules 120, 130 and 140 respectively collect data logs. In an example, the data logs include information of the defective memory portion, repair statistics, and the like.

Further, the data logs are conveyed through the pipe to the control circuit 115. Based on the data logs, in an example, the control circuit 115 broadcasts a repair instruction to a portion or all of the memory modules 120, 130 and 140 that need repair. In response to the repair instruction, the memory modules 120, 130 and 140 perform self-repair and re-test, and generate updated data logs. The updated data logs are then conveyed through the pipe to the control circuit 115.

It is noted that the IC chip 100 can include multiple pipes to enable the control circuit 115 to control memory test and repair for a large number of memory blocks. In an example, the IC chip 100 includes about three thousands memory blocks of about 270 Mbits total memory. The memory blocks are similarly configured as the memory block 123. The memory blocks are coupled with the control circuit 115 via multiple pipes. The IC chip 100 can send test and repair instructions to the memory blocks via the multiple pipes, and the memory blocks can perform memory test and memory repair simultaneously to test and repair at the same time.

According to an embodiment of the disclosure, the control circuit 115 stores the data logs, for example in a non-volatile memory on the chip 100 or off the chip, for future usage. In an example, at a power-up time, the previously stored data logs are retrieved, and the control circuit 115 conveys the data logs to the memory modules 120, 130 and 140. The data logs are then used by the memory modules 120, 130 and 140 to configure, for example the state machines, for repairing defective portions that are detected previously.

According to an aspect of the disclosure, the IC chip 100 performs memory test and repair at production. In an example, after the IC chip 100 is manufactured, a tester 101 is coupled to the IC chip 100. The IC chip 100 includes an interface module 111 configured to interface the control circuit 115 with external components, such as the tester 101. The tester 101 sends an instruction to the IC chip 100 to initiate a test and repair process. The control circuit 115 receives the instruction, controls the memory modules 120-140 to perform memory test and repair, and reports results, such as repair pass or repair fail, to the tester 101.

According to another aspect of the disclosure, the IC chip 100 performs memory test and repair in a user system. In an example, the user system includes a user system host 102, such as a system controller, and the like coupled with the IC chip 100 in the system. The user system host 102 provides an instruction to the IC chip 100 to initiate a test and repair process. The user system host 102 can provide the instruction at a power up time or in response to a user command to perform a diagnosis. The control circuit 115 receives the instruction, controls the memory modules 120, 130 and 140 to perform memory test and repair, and reports results, such as repair pass or repair fail, to the user system host 102. In another example, the IC chip 100 is configured to perform a test and repair process each time when the IC chip 100 is powered up.

Figure 2:
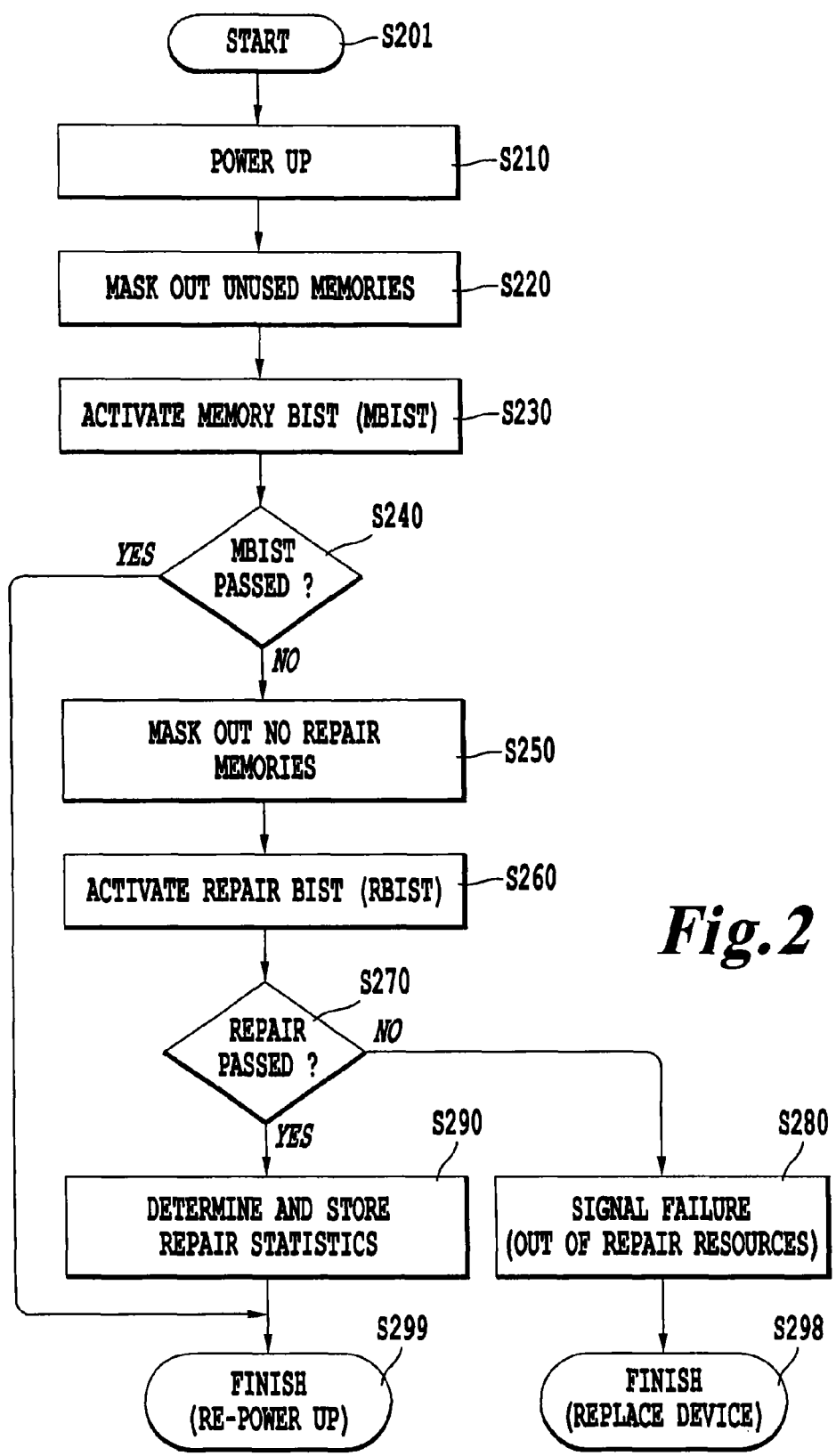
FIG. 2 shows a flow chart outlining a process example 200 according to an embodiment of the disclosure.

FIG. 2 shows a flow chart outlining a process example to test and repair memory on an IC chip, such as the IC chip 100, according to an embodiment of the disclosure. The process starts at S201, and proceeds to S210.

At S210, the IC chip 100 is powered up. In an example, the IC chip 100 is powered up by a tester. In another example, the IC chip 100 is powered up in a user system.

At S220, the unused memories are masked out. In an example, the IC chip 100 is a network switch that includes multiple ports. The IC chip 100 includes a large amount of memory in which various queues for the multiple ports are defined, for example. In a specific system or in a specific mode of operation, some queues are unused, and the memory portion that is allocated for those queues can be masked out.

At S230, memory BIST is activated. In an example, the control circuit 115 sends an instruction for memory test to memory modules, such as the memory modules 120-130, and the like, via the multiple pipes. In response to the instruction to perform a memory test, the module control circuits, such as the module control circuit 121 and the like, broadcast BIST configurations to memory blocks, such as the memory blocks 123-124, and the like, to test the memory blocks. In an example, in response to the BIST configurations, the memory blocks provide responses, and wrapper circuits, such as the wrapper circuit 150, and the like, analyze the responses, determine and indicate defective portions in the memory blocks. In an embodiment, the wrapper circuits provide data logs, such as information of the defective portions, repair statistics and the like, to the control circuit 115 via the multiple pipes.

At S240, the control circuit 115 determines whether the IC chip 100 passes or fails the memory test. When the control circuit 115 determines that the IC chip 100 passes the memory test, the process proceeds to S299; otherwise, the process proceeds to S250.

At S250, no-repair memory portion is masked out. In an example, the control circuit 115 determines memory modules that do not need repair, and masks out the determined memory modules.

At S260, the repair BIST is activated. In an example, the control circuit 115 broadcasts via multiple pipes an instruction for memory repair to memory modules that need repair. In response to the instruction for memory repair, the module control circuits, such as the module control circuit 121 and the like, broadcast repair instructions to memory blocks, such as the memory blocks 123-124. In response to the repair instructions, the wrapper circuits are configured to use the redundant portions in place of the defective portions during operation.

Further, in an embodiment, after the memory repair, the module control circuits, such as the module control circuit 121, and the like, broadcast BIST configurations to the memory blocks, such as the memory blocks 123-124, and the like, to re-test the memory blocks. In an example, in response to the BIST configurations, the memory blocks provide responses, and wrapper circuits, such as the wrapper circuit 150, and the like, analyze the responses, determine and indicate whether the memory blocks have additional defective portions, and also determine repair statistics, such as whether the memory blocks have repair resources. In an embodiment, a module control circuit repetitively broadcasts the repair instructions, and the BIST configurations, until all the memory blocks coupled to the module control circuit pass the re-test, or at least one of the memory block runs out of repair resources, or the repair and re-test process has been repeated for a number of times, such as three times for example. Then, the module control circuit generates updated data logs and sends the updated data logs to the control circuit 115 via a suitable pipe.

At S270, the control circuit 115 determines whether the IC chip 100 passes or fails the repair and re-test. When the IC chip 100 fails the repair and re-test, the process proceeds to S280; otherwise, the process proceeds to S290.

At S280, the control circuit 115 signals the external components, such as the tester 101, the user system host 102, and the like of the failure. Then, the process proceeds to S298, and terminates. It is noted that when the IC chip 100 is in a user system, the IC chip 100 is then replaced.

At S290, the repair information is suitably stored. In an example, the information of the defective portions is stored in a non-volatile memory on the IC chip 100. Then, the process proceeds to S299 and terminates. It is noted that when the IC chip 100 is in a user system, the IC chip 100 can be re-powered up.

It is noted that the process in FIG. 2 can be suitably modified. In an example, S290 is omitted.

Figure 3:
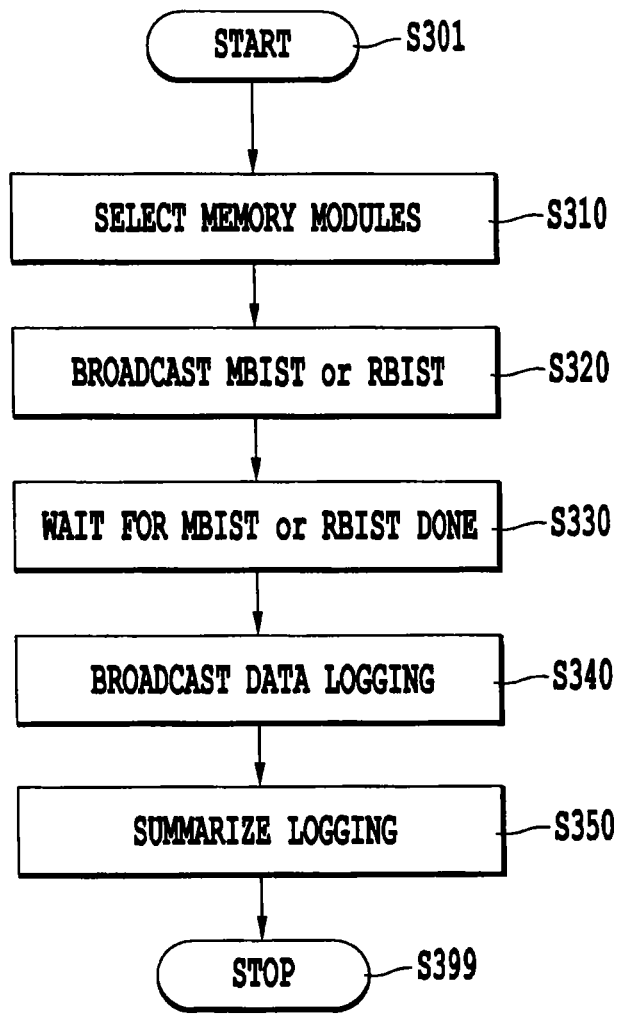
FIG. 3 shows a flow chart outlining a process example 300 according to an embodiment of the disclosure.

FIG. 3 shows a flow chart outlining a process example according to an embodiment of the disclosure. In an embodiment, the control circuit 115 behaves like a server and the memory modules, such as the memory modules 120-140, behave like clients. In an example, the control circuit 115 is implemented as a processor executing software instructions, and the processor executes a set of software instructions to perform the process in FIG. 3. The process starts at S301 and proceeds to S310.

At S310, memory modules are selected. In an example, an IC chip includes multiple pipes formed of multiple memory modules. The control circuit 115 uses bits in a vector to identify the pipes and addressing scheme to identify the memory modules. By suitably setting the values of the bits in the vector and the memory modules address, the control circuit 115 selects the memory modules that execute the instruction. For example, each group of memory modules can be selected by using a specific address designated for the group of memory modules, and all memory modules can be selected by using a specific address designated for all memory modules.

At S320, the control circuit 115 broadcasts an instruction for memory BIST or repair BIST in the selected pipes.

At S330, the control circuit 115 waits for the memory BIST or the repair BIST to finish. In an embodiment, the control circuit 115 waits for a pre-determined time that is enough for the memory BIST or the repair BIST to finish.

At S340, the control circuit 115 broadcasts an instruction for activating data logging function in the memory modules. In response to the instruction, the client memory modules provide data logs to the control circuit 115.

At S350, the control circuit 115 reads, analyzes and summarizes the data logs from the client memory modules. In an embodiment, based on the data logs, the control circuit 115 determines whether the memory portion of the IC chip 100 passes the memory BIST or the repair BIST. In an example, the control circuit 115 then reports the results. In another example, the control circuit 115 determines whether repair BIST or additional repair BIST is needed. Then, the process proceeds to S399 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
   a memory module that includes one or more memory blocks with each memory block including:
      a memory array having a first memory portion and a redundant memory portion;
      a failed memory indicator within the memory block that, in response to a memory test, is configured to provide an indication of a failed memory portion in the first memory portion;
      a state machine configured to provide the indication of the failed memory portion; and
      a wrapper circuit that, in response to the indication of the failed memory portion, is configured to repair the memory array by using the redundant portion instead of the failed memory portion.

2. The IC chip of claim 1, wherein the failed memory indicator is a part of the wrapper circuit.

3. The IC chip of claim 1, wherein the memory module further comprises:
   a module control circuit configured to cause the memory test to be performed in the memory blocks.

4. The IC chip of claim 3, wherein the module control circuit comprises:
   a built-in self-test (BIST) circuit configured to generate BIST configurations for the memory test to be performed in the memory blocks.

5. The IC chip of claim 4, wherein the module control circuit is configured to broadcast the BIST configurations to the memory blocks to perform the memory test in the memory blocks.

6. The IC chip of claim 4, wherein the module control circuit is configured to broadcast the BIST configurations to the memory blocks to perform memory test in the memory blocks after the wrapper circuit repairs the memory array.

7. The IC chip of claim 1, further comprising:
   a control circuit coupled with the memory module and other memory modules in a server-client manner to control memory test and memory repair.

8. The IC chip of claim 7, wherein the control circuit is configured to store information of the failed memory portion of the memory block and load the stored information to the memory block in response to a next power-up.

9. The IC chip of claim 7, wherein the control circuit is configured to operate in response to at least one of a tester that tests the IC chip and a host controller coupled with the IC chip in a system.

10. The IC chip of claim 1, wherein the wrapper circuit includes a soft repair register (SRR) configured to cause using the redundant portion instead of the failed memory portion.

11. A method of repairing a memory block having a memory array including a first memory portion and a redundant memory portion, comprising:
   providing, within the memory block, an indication of a failed memory portion in the first memory portion of the memory array in response to a memory test by using a state machine of the memory array in the memory block; and
   repairing the memory array by using the redundant portion instead of the failed memory portion based on the indication within the memory block that is indicative of the failed memory portion.

12. The method of claim 1, wherein providing, within the memory block, the indication of the failed memory portion in the first memory portion of the memory array in response to the memory test further comprises:
providing the indication of the failed memory in a wrapper circuit of the memory array in the memory block.

13. The method of claim 11, further comprising:
causing the memory test to be performed in a plurality of memory blocks.

14. The method of claim 13, wherein causing the memory test to be performed in the plurality of memory blocks comprises:
generating test configurations by a built-in self-test (BIST) circuit.

15. The method of claim 14, further comprising:
broadcasting the test configurations to the memory blocks to perform the memory test in the memory blocks.

16. The method of claim 14, further comprising:
broadcasting the test configurations to the memory blocks to perform a re-test after the memory array is repaired.

17. The method of claim 11, further comprising:
controlling a plurality of memory modules for memory test and repair by a control circuit in a server-client manner.

18. The method of claim 17, further comprising:
storing information of the failed memory portion of the memory block; and
loading the stored information to the memory block in response to a power-up.

19. The method of claim 17, further comprising at least one of:
controlling the plurality of memory modules in response to a tester that tests an integrated circuit (IC) chip; and
controlling the plurality of memory modules in response to a host controller in a system.

* * * * *